Sept. 15, 1959 N. J. REGNIER 2,904,612

RADIANT ENERGY CONVERTER

Filed July 30, 1956

NORMAN J. REGNIER
*INVENTOR.*

BY [signature]

HIS ATTORNEY

United States Patent Office 2,904,612

Patented Sept. 15, 1959

2,904,612

RADIANT ENERGY CONVERTER

Norman J. Regnier, Los Angeles, Calif., assignor to Hoffman Electronics Corporation, a corporation of California

Application July 30, 1956, Serial No. 600,901

1 Claim. (Cl. 136—89)

This invention relates to radiant energy reflection and, more particularly, to radiant energy reflectors adapted to reflectively direct radiant energy tending to impinge upon non-useful areas to other areas provided with radiant energy converters.

There is relatively little prior art in the field of radiant or solar energy reflection, partially due to the only recent development of this field. Numerous reflectors and deflectors have been devised in other fields, such as the single-source light directors for taking the rays of substantially single-point light and directing them in parallel and/or focused beams, and astronomical instruments adapted to focus single-source rays onto a single reception device. However, none of the prior art devices are adaptable for use with a plurality of radiant or solar energy converters so that the energy normally tending to impinge upon the useless area or areas between the converters may be reflectively directed upon the energy converters for greatly increased overall area efficiency.

One object of this invention is to provide radiant energy reflector means adapted to intercept radiant energy normally tending to impinge upon non-converting areas and reflectively direct said radiant energy so as to impinge upon radiant energy converter means.

Another object of the present invention is to provide radiant energy reflector means arranged in effectively interposed relationship with respect to secondary areas and radiant energy tending to impinge upon such areas, said secondary areas being in effectively co-planar relationship with respect to primary areas adapted to utilize received radiant energy, said reflector means being adapted to reflectively direct radiant energy onto said primary areas.

A further object of the present invention is to provide a plurality of geometrically arranged radiant energy converters with radiant energy reflectors in interposed juxtaposition therewith so that radiant energy tending to impinge upon secondary areas between the converters will be intercepted and reflectively directed onto the converters in a substantially equally diffused manner.

According to the present invention, a plurality of primary areas, each of which may be provided with a solar cell, for example, are delineated by reflective apparatus contiguous therewith adapted to reflectively direct light which would normally fall between the aforementioned primary areas onto those areas, in order to provide a maximum utilization of the light or other energy which would tend to impinge upon or pass through the combined areas of the primary areas and the non-converting areas therebetween.

The features of the present invention which are believed to be novel are set forth with particularity in the appended claim. The present invention, both as to its organization and manner of operation, together with further objects and advantages thereof, may best be understood by reference to the following description, taken in connection with the accompanying drawings, in which:

Figure 1:
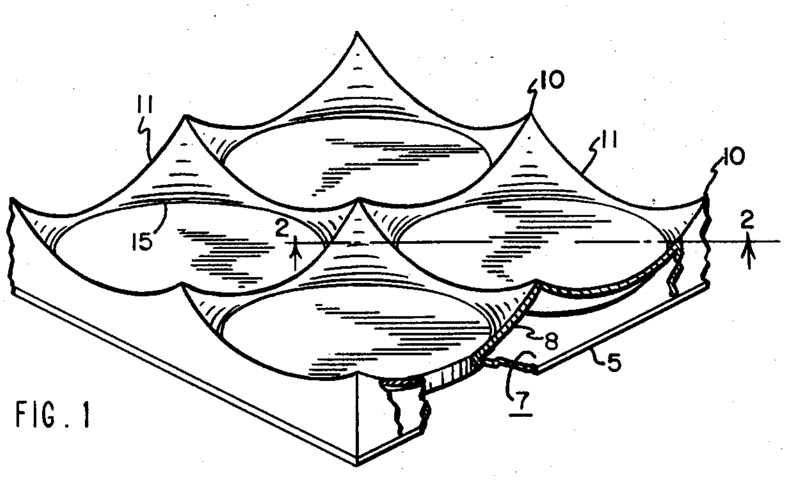
Figure 1 is a perspective view of one particular embodiment of the present invention.

Referring to Figure 1, there is seen a mounting plate 5 provided with a plurality of radiant energy converters 6, which may comprise photovoltaic or solar cells, for example. The cells 6 are of a circular configuration, at least as far as their outwardly disposed area is concerned, and generally are placed, as shown, in substantially juxtaposed, co-planar relationship with respect to each other so as to utilize the primary area occupied by the solar cells in a most effective and efficient manner, thereby forming a geometrically symmetrical pattern of rows and columns.

For purposes of definition, and not in an otherwise limiting sense, the area or areas occupied by the converter elements 6 may be referred to as the primary area or areas, and the area or areas of the plate 5 not fitted with such converters may be referred to as the secondary areas or areas 7. Upwardly and outwardly disposed from the plate 5 and in energy-intercepting relationship with respect to secondary area 7 are a plurality of reflector elements 8, whose bases 15 are in peripherally encompassing relationship with respect to the solar cells 6. For purposes of illustration, and not in an otherwise limiting sense, reflector elements 8 may consist of inverted intersecting frustums of cones circumscribing circular solar cells. As may be seen more clearly in Figure 4, each cell 6 may be considered as being a substantially inscribed circle with respect to the square area portion of its surrounding secondary area, the latter being "covered" by an individual reflector 8.

Figures 2, 3:
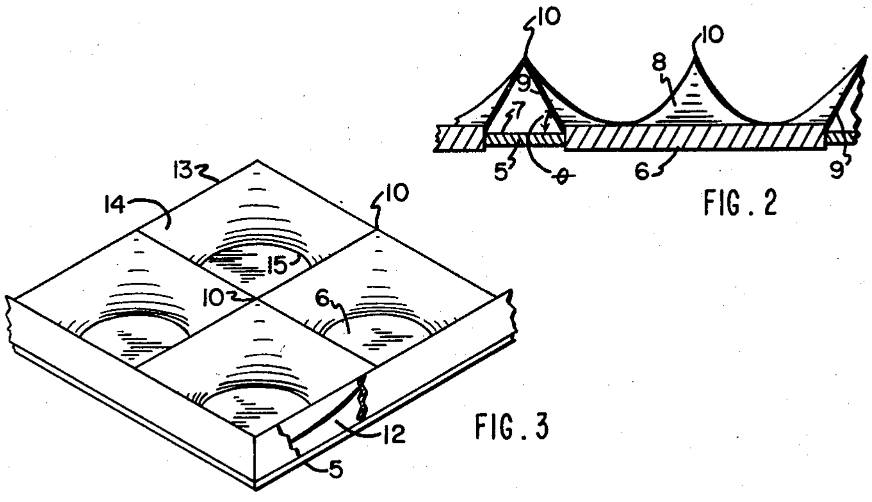
Figure 2 is an elevational view (partly in cross-section) of a portion of the device illustrated in Figure 1, as seen along lines 2—2.
Figure 3 is a perspective view of an additional embodiment of the present invention.

As seen in Figure 2, the preferred reflector element 8 is shaped so that any vertical plane passing through the center of any receptor 6 intersects the reflector 8 to form a straight line 9. Any such line 9 should have a slope or angle $\theta$ with respect to the planes of the plate 5 and the converters 6 such that all of the vertical rays of the sun, or other radiant energy source, impinging upon the reflector 8 will be reflected angularly and downwardly so as to impinge upon the converter 6. The angle $\theta$ would be naturally somewhat greater than 45°, the exact value depending upon whether it is desired to reflect the rays across the entire surface of the converter 6 or just in the peripheral regions. For example, in the embodiment illustrated in Figures 1, 2 and 4, wherein the converters 6 are practically touching each other, the value of angle $\theta$ required to diffuse the reflected rays in a vertical plane through each corner point or vertex 10 across the entire surface of the converter 6 is approximately 51°. On the other hand, maximum reflection across only one-half of the converter 6 would require an angle $\theta$ of approximately 57.3°. It should be noted that the indicated values of angle $\theta$ are only exemplary for particular conditions, and are not intended to define or otherwise limit the scope of the present invention, as the angle $\theta$ may be given any value desired as long as the reflected rays will impinge upon some portion of the converter area. The height of the vertex 10 above the converter 6 is determined mathematically in a similar manner in accordance with the dimensions of the converter and the proper angle $\theta$. Increasing the angle $\theta$ beyond the value required in the case of perpendicular reception of the radiant energy will decrease the required directivity of the converter system.

The reflector's outwardly disposed polygonal edges, such as 11, may be symmetrically curved downwardly from the vertices 10 to substantially the plane of the converters 6 to permit the maintenance of the same angle θ or slope of the reflector 8 with respect to the converter 6, such curve being shown in Figures 1 and 2. The curve of the edges 11 offers the additional advantage of decreasing the required directivity of the solar energy converter system. Thus, the sun's rays may be received at an angle other than normal to the cells 6 without the reflectors casting shadows across the cells.

Figure 4:
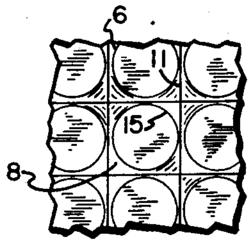
Figure 4 is a reduced size, fragmentary, top plan view of a portion of the device illustrated in Figure 1.

In the embodiment of the present invention wherein the converters 6 are almost touching each other, as illustrated in Figure 4, the reflectors offer an optimum increase in energy-gathering efficiency of approximately 27%, being the percentage ratio of secondary area to primary area.

Figure 3 illustrates a second embodiment of the present invention having particular reference to the instance of radiant energy converters, such as cells 6, being in somewhat separated relationship to each other so that the secondary area 12 is of considerably increased proportions. The polygonal edges 13 of the reflectors 14 form a planar grid parallel to the plane of the cells 6 and plate 5. With respect to the configuration of the surfaces of the reflectors 14, vertical planes through the center of the cell 6 may intersect straight lines, such as line 9 in Figure 2, in which case the angle between the line 9 and the receptor 6 would form a minimum angle of somewhat more than 45° at the intersection points or vertices 10. The angle of slope of the reflector 14 would vary to a maximum value at a point midway between the vertices 10. Of course, the greater the separation between converters, the greater would be the energy-gathering efficiency of the reflectors with respect to the converters.

With particular reference to the use of the present invention with solar cells, it is found to be more desirable to use the "straight line" configuration of the reflector surfaces in order to diffuse the reflected solar rays over a larger area of the solar cells than would be the case if curved configuration were used with its resultant complete or partial focalizing effect. Because of the fact that solar cells may be associated with directive equipment so that the sun's rays tending to impinge upon the primary area will be in substantially perpendicular relation thereto, it is possible, by the above-described variations in both the height and top-edge characteristics of the reflectors, to achieve diffusion of the reflected rays over substantially all of the primary area in substantially equal quantities of energy. However, the present invention is not intended to be limited necessarily to "straight line" configuration of the reflector surfaces, as the scope of this invention is broader than any such particular shape or configuration. The device of Figure 3 is particularly adaptable for curved construction due to the relatively large secondary area involved.

Although the embodiments illustrated demonstrate the use of the present invention with reflectors having generally square-grid appearance, this invention is not limited thereto but may include the use of hexagonal or any other polygonal construction adapted for symmetrical juxtaposition. In fact, and except for the objection of difficulty of construction, non-similar polygons may be employed in any combination.

It should be understood that the term "secondary area" is not limited to the portions of the plate 5 other than the primary areas but includes all areas between the primary areas, whether occupied by a plate 5 or not. For example, the plate 5 may be eliminated entirely by merely fitting the converters 6 into the bases 15 of the reflectors 8.

While particular embodiments of the present invention have been shown and described, it will be obvious to those skilled in the art that changes and modifications may be made without departing from this invention in its broader aspects, and, therefore, the aim in the appended claim is to cover all such changes and modifications as fall within the true spirit and scope of this invention.

I claim:

A radiant energy converter for converting radiant energy into electrical energy, comprising a substantially planar base member, a plurality of radiant energy converter cells disposed across one face of said base member in a uniform and symmetrical pattern covering the major portion of said face, said cells all having active faces substantially parallel to said face of said base member and directed away from said base member in a common direction, and a plurality of substantially frustoconical annular reflecting elements each encircling the periphery of a respective one of said cells and mounted on said base member to provide for each cell an encircling reflecting surface at a significant angle with respect to the active face of said cell, the reflecting elements of adjacent ones of said cells being contiguous at their edges and the area of said face of said base member covered by the said reflecting elements being coextensive with the area of said face of said base member not covered by said cells, whereby radiation arriving from said common direction which would otherwise impinge upon said coextensive area is reflected by the several reflecting elements onto portions of the active faces of respective ones of said cells.

References Cited in the file of this patent

UNITED STATES PATENTS

| | | |
|---|---|---|
| 235,497 | Bell et al. | Dec. 14, 1880 |
| 1,390,883 | Case | Sept. 13, 1921 |
| 2,137,466 | Tonnies | Nov. 22, 1938 |